United States Statutory Invention Registration [19]

[11] Reg. Number: H497

Piasecki

[43] Published: Jul. 5, 1988

[54] RATIOED POWER ON RESET CIRCUIT

[75] Inventor: Douglas S. Piasecki, Phillipsburg, N.J.

[73] Assignee: The United States of America as represented by the Secretary of the Air Force, Washington, D.C.

[21] Appl. No.: 3,170

[22] Filed: Jan. 14, 1987

[51] Int. Cl.[4] ..... H03K 5/13

[52] U.S. Cl. ..... 307/594; 307/296 R

[56] References Cited

U.S. PATENT DOCUMENTS

| | | | |
|---|---|---|---|
| 3,628,070 | 12/1971 | Heuner et al. | 307/304 |
| 3,753,011 | 8/1973 | Faggin | 307/247 R |
| 3,809,926 | 5/1974 | Young | 307/235 R |
| 3,895,239 | 7/1975 | Alaspa | 307/268 |
| 3,950,654 | 4/1976 | Broedner et al. | 307/208 |
| 4,196,362 | 4/1980 | Maehashi | 307/350 |
| 4,385,245 | 5/1983 | Ulmer | 307/594 |
| 4,553,054 | 11/1985 | Kase et al. | 307/597 |

*Primary Examiner*—Stephen C. Buczinski
*Assistant Examiner*—Linda J. Wallace

[57] ABSTRACT

A ratioed power on reset apparatus utilizing two pairs of field effect transistors as voltage dividers to generate a power on reset signal which tracks the waveshape of an applied power signal with a slot rise time.

4 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

RATIOED POWER ON RESET CIRCUIT

STATEMENT OF GOVERNMENT INTEREST

The invention described herein may be manufactured and used by or for the Government for governmental purposes without the payment of any royality thereon.

BACKGROUND OF THE INVENTION

The present invention relates broadly to a power on reset circuit, and in particular to a ratioed power on reset apparatus.

Typically prior art power on reset (POR) circuits employed discrete components to establish RC time constants to establish and control the power on reset (POR) pulse. This technique presents problems and difficulties in maintaining a POR signal for power supplies, $V_{DD}$ with slow rise times which exceed the RC time constant established by the POR circuit. Also many POR circuits result in a undesirable quiescent current. The present invention provides a circuit that relies on voltage levels rather than voltage transients to establish a POR signal and ends in a zero current state.

The state of the art of power on reset circuits is well represented and alleviated to some degree by the prior art apparatus and approaches which are contained in the following U.S. patents and incorporated by reference herein:

U.S. Pat. No. 4,553,054 issued to Kase et al on Nov. 12, 1985;

U.S. Pat. No. 3,895,239 issued to Alaspa on July 15, 1975;

U.S. Pat. No. 4,385,245 issued to Ulmer on May 24, 1983;

U.S. Pat. No. 4,196,362 issued to Maehashi on Apr. 1, 1980;

U.S. Pat. No. 3,950,654 issued to Broedner et al on Apr. 13, 1976; and

U.S. Pat. No. 3,753,011 issued to Faggin on Aug. 14, 1973.

Kase et al discloses a power on reset circuit for use with a microprocessor to trigger the microprocessor's initialization subroutine. A rest pulse is applied to the microprocessor 4 when a power supply voltage $V_{DD}$ is applied to terminal 10. The duration of the output pulse produced by the patented circuit is not affected by the rise time of the applied voltage $V_{DD}$, the pulse duration being determined by the ratio of the capacities of the capacitors 16 and 18.

Alaspa discloses an automatic power on reset circuit which is adapted for use on complementary MOS integrated circuit semiconductor dies. The circuit includes a voltage reference stage followed by an amplifier stage. A PN diode is coupled in series with a diode-connected MOSFET and a low current MOSFET device to provide a slight overdrive to the P-channel MOSFET of a CMOS inverter, which determines the initial output level thereof. As the voltage applied to the power supply conductor increases, the switching point of the amplifier-inverter stage varies until the output thereof assumes the opposite logic level. This transition of the output of the amplifier inverter stage is applied to wave shaping circuitry and an output circuit which reliably produces the desired reset signal.

Ulmer discloses a power on reset circuit which deletes the need for resistors uses a current source transistor and a capacitor to provide a minimum time for the power on reset signal.

Machashi generates a clear signal for initializing a logic circuit when the power supply voltage reaches or exceeds a predetermined level.

Broedner et al is concerned with an initializing circuit which includes feedback and is used to initialize all the relevant storage elements in an electronic calculator.

Faggin shows a circuit for setting a flip-flop using MOS technology and not requiring the fabrication of an RC circuit. The present invention is directed to a ratioed power on reset circuit that addresses the short comings of the prior art apparatus.

SUMMARY OF THE INVENTION

The present invention utilizes field effect transistors (FETs) in a series-parallel circuit to function as a voltage dividers so that the circuit relies on voltage levels rather than voltage transients to establish a POR signal. When the power supply source signal $V_{DD}$ begins to rise, the POR signal from the circuit tends to follow the power supply source $V_{DD}$ from zero to about 3 volts. The POR signal then goes low and is locked in the low condition. The circuit utilizes the same conductivity FET device in series because it is easier to maintain the correct voltage ratios over variations in mobility and threshold voltage than for complementary FET devices in series.

It is one object of the present invention, therefore, to provide an improved ratioed power on reset apparatus.

It is another object of the invention to provide an improved ratioed power on reset apparatus which provides a power on reset signal for slow power supply rise times.

It is still another object of the invention to provide an improved ratioed power on reset apparatus which utilizes a voltage divider to establish a power on reset signal.

It is a further object of the invention to provide an improved ratioed power on reset apparatus which reacts to voltage levels rather than voltage transients.

It is an even further object of the invention to provide an improved ratioed power on reset apparatus in which the voltage dividers utilize solid state devices with the same conductivity.

It is yet another object of the invention to provide an improved ratioed power on reset apparatus which utilizes solid state devices to maintain the correct voltage ratios over variations in mobility and threshold voltage.

These and other advantages, objects and features of the invention will become more apparent after considering the following description taken in conjunction with the illustrative embodiment in the accompanying drawings.

DETAILED DESCRIPTION OF THE PREFERRED EMBODIMENTS

Figure 1:
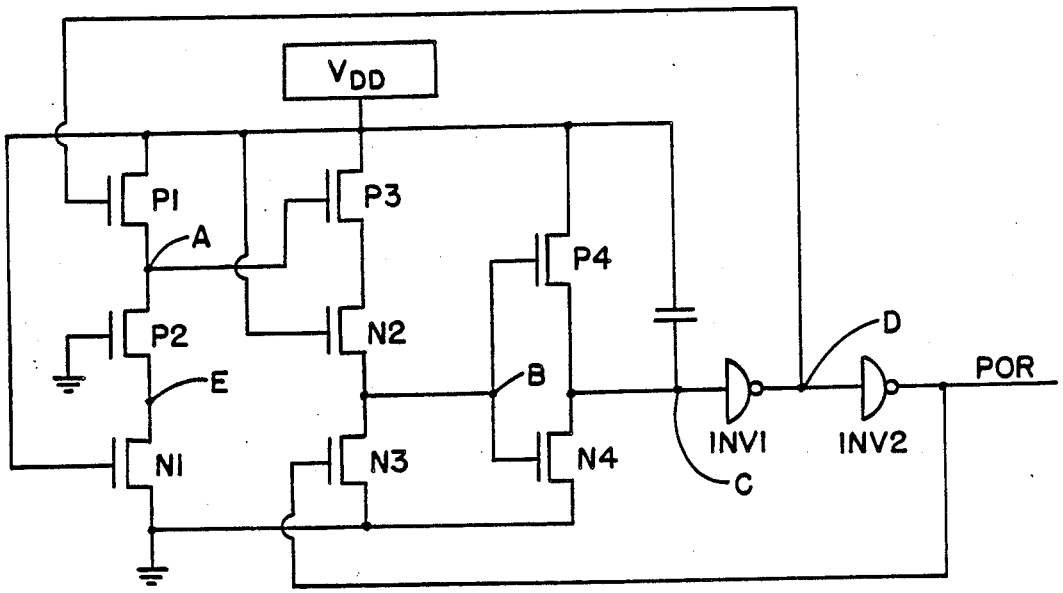
FIG. 1 is a schematic diagram of the ratioed power on reset apparatus according to the present invention.

Referring now to FIG. 1, there is shown a schematic diagram of the ratioed power on reset apparatus wherein a power on reset (POR) signal is generated in response to the voltage level of an applied power supply source signal, $V_{DD}$. The present apparatus provides a POR signal which is utilized to reset memory units and/or other circuit elements when power, $V_{DD}$ from a power supply is initially applied to a circuit or system. It should be well understood that the power that is being applied to the memory, etc. circuits or systems, is also simultaneously being applied to the ratioed power on reset apparatus. The present power on reset apparatus substantially comprises three parallel circuits which contain a predetermined number of field effect transistors in series. The first parallel circuit contains field effect transistors P1, P2 and N1 which are connected in series between the power supply signal $V_{DD}$ and ground. The FETs P1, P2 are arranged in series to form a voltage divider means. The source of FET, P1 is connected to the power supply signal, $V_{DD}$. The drain of FET, N1 is connected to ground. The FET, P2 which has its gate connected to ground, has its drain connected to the drain of FET, N1 and also has its source connected to the drain of FET, P1.

The second parallel circuit comprises field effect transistors P3, N2 and N3 which are connected in series between the power supply signal $V_{DD}$ and ground. The FETs N2, N3 are arranged in series to form a voltage divider means. The source of FET, P3 is connected to the power supply signal, $V_{DD}$. The source of FET, N3 is connected to ground. The FET, N2 which has its gate connected to $V_{DD}$, has its source connected to the drain of FET, N3 and also has its drain connected to the drain of FET, P3.

The third parallel circuit comprises field effect transistor P4 and N4 which are connected in series between the power supply signal $V_{DD}$ and ground. The source of FET, P4 is connected to the power supply signal, $V_{DD}$ while the source of FET, N4 is connected to ground. The gates of FETs, P4 and N4 are connected to each other and to the common junction between FETs, N2 and N3. The common junction between FETs, P4 and N4 is connected to the input of inverter, INV 1. A capacitor, C1 is connected between the power supply signal $V_{DD}$ and the input to inverter INV 1. The output of inverter INV 1 is respectively connected to the gate of FET, P1 and the input to inverter INV 2. The output of inverter INV 2 provides the output signal POR and is also connected to the gate of FET, N3. The gates of FETs, N1 and N2 are respectively connected to the power supply signal $V_{DD}$. The gate of FET, P3 is connected to the common junction between FETs, P1 and P2.

Figure 2:
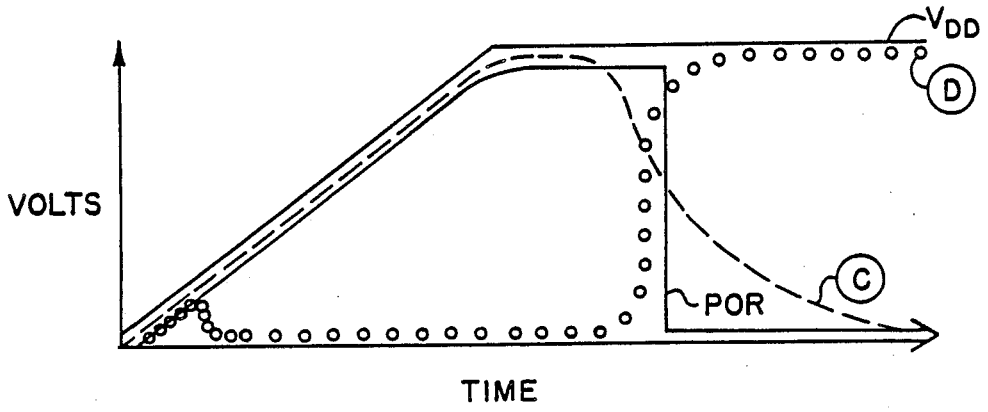
FIG. 2 is a graphical representation of voltage waveforms in the apparatus of FIG. 1.

The ratioed power on reset apparatus operates in the following manner. Referring still to FIG. 1, assume, for simplicity, that the P and N device voltage thresholds are equal. When the power supply source signal $V_{DD}$ begins to rise, the labelled nodes in the circuit will tend to follow the power supply source signal (see FIG. 2) $V_{DD}$ until a threshold voltage is reached. At this point, some of the FET devices will begin to turn on. Referring now in particular to node C, assume that this node will remain at the higher voltage and is not discharged by FET N4. Since node C is a bit above the threshold voltage $V_{TN}$ for the inverter unit, INV 1, the N-type device of INV 1 will turn on and pull node D low, and this in turn, will cause inverter INV 2 to pull node POR high. When the signal POR is high, it will turn on FET N3 which pulls node B low, thus causing FET N4 to remain off. Thus, it may be seen that the initial assumption for node C is a good one.

At this point, since the power supply signal $V_{DD}$ is a little greater than an FET threshold value, it will be seen that FET N1 will turn off, pulling node E low. When node D becomes low, it will turn on FET P1. Now the input of FET P2 is tied to ground, and thus FET P2, by the way it's connected, will try to keep node A a threshold voltage above node E. Thus, since FET P1 is turned on, it can pull node A to the value of the power supply signal $V_{DD}$ and FET P3 is off. Note, at this time the power supply signal $V_{DD}$ is only above one threshold voltage by a tiny bit. FET N2 is on but FET P3 is off, thus FET N3 has no problem pulling node B low. FET N3 will continue to hold node B low until FET P3 turns on. The ratioes for the N2/N3 FET devices, are chosen such that when FET P3 turns on node B will equal one threshold voltage when the power supply signal $V_{DD}=3V$. The P1/P2 FET device ratios are also chosen such that node A will be one threshold voltage below the power supply signal $V_{DD}$ when $V_{DD}=3V$. At this point ($V_{DD}=3V$) FET P3 can turn on then node B will rise to 1 Vth. Vth represents the threshold voltage of an FET device. Node B being 1Vth allow FET N4 to turn on thus discharging node C, node D in turn goes high ($V_{DD}$) and node POR goes low. Note that node POR going low is the end of the POR (power on reset) pulse. When node D goes high, FET P1 turns off and FETs P2 and N1 will pull node A toward ground, turning FET P3 on even more than it was before. This will tend to pull node B higher and in turn on FET N4 even harder. Node POR going low, turns FET N3 off and thus node B will be pulled high through FETs P3 and N2.

Thus in summary, node (POR) will follow a rising power supply signal $V_{DD}$ from 0V to 3V and then POR will go low. FETs P1 and N3 will then turn off and lock in the low POR. The FET devices P1/P2 and N2/N3 are being used as voltage dividers. The choices of the same conductivity devices in series here for the FET pairs P1/P2 and N2/N3 is because it is easier to maintain the correct voltage ratioes over variations in mobility and threshold voltages then for complementary FET devices in series.

Although the invention has been described with reference to a particular embodiment, it will be understood to those skilled in the art that the invention is capable of a variety of alternative embodiments within the spirit and scope of the appended claims.

What is claimed is:

1. A ratioed power reset apparatus comprising in combination:

a source providing a power supply signal which upon initial application increases from zero volts to some predetermined constant value, said power supply signal being applied to a power bus and referenced to ground, a first control circuit comprising a first means for dividing voltage and a first means for controlling, said first voltage dividing means connected in series to said first controlling means, said first control circuit connected between said power bus and ground, a second control circuit comprising a second means for dividing voltage and a second means for controlling, said second voltage dividing means connected in series to said second controlling means, said second control circuit connected between said power bus and ground, a third control circuit comprising a third and fourth means for controlling, said third and fourth controlling means connected in series, said third and fourth controlling means comprising complementary semiconductor devices, said third third control circuit connected between said power bus and ground, said third and fourth controlling means providing an output at their common connection, a first means for inverting connected to receive said output from said third control circuit, and first inverting means having an input and an output, a second means for inverting, said second inverting means having an input and an output, said input of said second inverting means connected to said output of said first inverting means, said first voltage dividing means having a first and second input and an output, said output of said first inverting means connected to said first input of said first voltage dividing means, said second input of said first voltage dividing means connected to ground, said first controlling means having an input, said input of said first controlling means connected to said power bus, said output of said first voltage dividing means connected to the input of said second controlling means, said second voltage dividing means having a first and second input and an output, said first input of said second voltage dividing means connected to said power bus, said second input of said second voltage dividing means connected to said output of said second inverter means, said third and fourth controlling means respectively having an input, said inputs of said third and fourth controlling means connected together and to said output of said second voltage dividing means, so that as said power supply signal increases in amplitude towards its final value, a power on reset signal is generated at said output of said second inverter means, said power on reset signal tracks said power supply signal until said final value is reached and then said power on reset set signal abruptly changes to approximately zero volts.

2. A ratioed power reset apparatus as described in claim 1 wherein said first voltage dividing means comprises a pair of p-channel field effect transistors connected in series and said first control means comprises an n-channel field effect transistor.

3. A ratioed power reset apparatus as described in claim 1 wherein said second voltage dividing means comprises a pair of n-channel field effect transistors connected in series and said second control means comprises a p-channel field effect transistor.

4. A ratioed power reset apparatus as described in claim 1 wherein said third control means is a p-channel field effect transistor and said fourth control means is an n-channel field effect transistor.

* * * * *